United States Patent
Zhu et al.

(10) Patent No.: US 7,129,171 B2
(45) Date of Patent: Oct. 31, 2006

(54) SELECTIVE OXYGEN-FREE ETCHING PROCESS FOR BARRIER MATERIALS

(75) Inventors: Helen Zhu, Fremont, CA (US); Rao Annapragada, Union City, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/685,675

(22) Filed: Oct. 14, 2003

(65) Prior Publication Data

US 2005/0079725 A1    Apr. 14, 2005

(51) Int. Cl.
*H01L 21/302* (2006.01)
*H01L 21/4763* (2006.01)

(52) U.S. Cl. ............. 438/689; 438/711; 438/713; 438/724; 438/637; 438/638

(58) Field of Classification Search ........ 438/637–640, 438/687–688, 672–675, 700–702, 706–714
See application file for complete search history.

(56) References Cited

U.S. PATENT DOCUMENTS

| | | | |
|---|---|---|---|
| 4,431,477 A | 2/1984 | Zajac | |
| 5,786,276 A | 7/1998 | Brooks et al. | |
| 5,930,655 A * | 7/1999 | Cooney et al. | 438/474 |
| 6,060,400 A | 5/2000 | Oehrlein et al. | |
| 6,069,087 A | 5/2000 | Keller et al. | |
| 6,485,988 B1 * | 11/2002 | Ma et al. | 438/3 |
| 6,617,244 B1 * | 9/2003 | Nishizawa | 438/637 |
| 6,677,678 B1 * | 1/2004 | Biolsi et al. | 257/751 |
| 2002/0119664 A1 | 8/2002 | Annapragada et al. | |
| 2005/0037605 A1 * | 2/2005 | Kim et al. | 438/622 |

* cited by examiner

*Primary Examiner*—Thanh Nguyen
(74) *Attorney, Agent, or Firm*—IP Strategy Group, P.C.

(57) ABSTRACT

A method of etching a barrier layer in an integrated circuit (IC) wherein said barrier layer is composed of silicon nitride or silicon carbide. The method comprises receiving an etched IC structure having an exposed barrier layer. The method then proceeds to apply an etchant gas mixture comprising a nitrous oxide ($N_2O$) gas and a fluoromethane ($CH_3F$) gas. The etchant gas mixture provides a relatively high selectivity between the barrier layer to an adjacent dielectric layer.

15 Claims, 4 Drawing Sheets

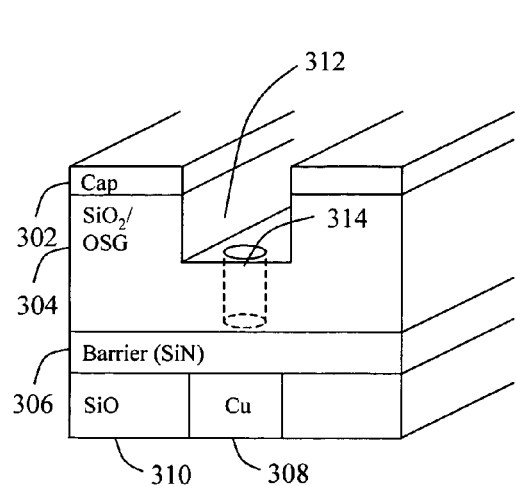
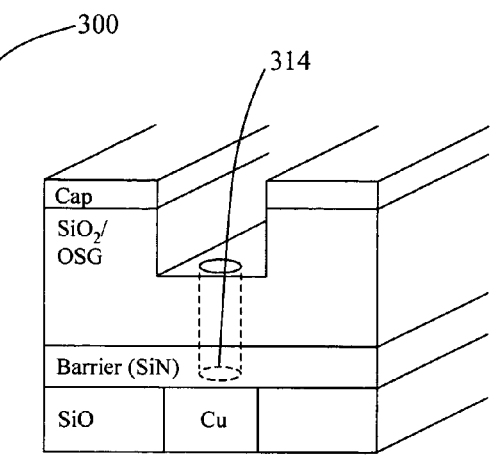
FIG. 3A  FIG. 3B
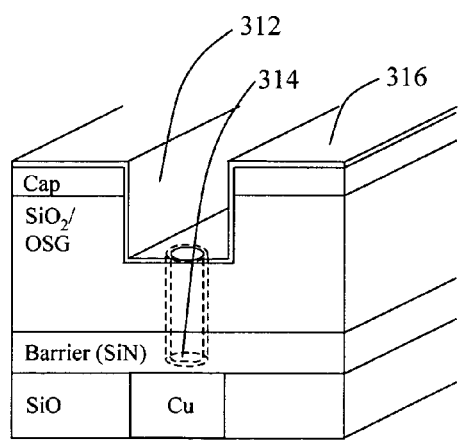
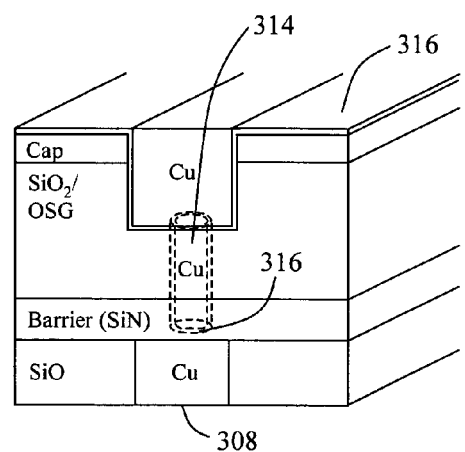
FIG. 3C  FIG. 3D

SELECTIVE OXYGEN-FREE ETCHING PROCESS FOR BARRIER MATERIALS

BACKGROUND

1. Field of Invention

The present invention relates to the etching of a barrier layer. More particularly, the invention relates to the etching of an integrated circuit (IC) structure having a barrier material such as silicon nitride (SiN) and silicon carbide (SiC).

2. Description of Related Art

Semiconductor devices are typically formed on a semiconductor substrate and often include multiple levels of patterned and interconnected layers. For example, many semiconductor devices have multiple layers of conductive lines (e.g., interconnects). Conductive lines or other conducting structures, such as gate electrodes, are typically separated by dielectric material (i.e., insulating material) and may be coupled together, as needed, by vias through the dielectric material.

During the semiconductor integrated circuit (IC) fabrication process, devices such as component transistors are formed on a semiconductor wafer substrate. Various materials are then deposited on different layers in order to build a desired IC. Typically, conductive layers may include patterned metallization lines, polysilicon transistor gates and the like which are insulated from one another with dielectric materials such as low-k dielectric materials.

Low-k materials are incorporated into IC fabrication using a copper dual damascene process. A dual damascene structure employs an etching process that creates trenches for lines and holes for vias. The vias and trenches are then metallized to form the interconnect wiring. The two well-known dual damascene schemes are referred to as a via first sequence and a trench first sequence.

During the dual damascene process, one or more barrier layers are typically used to protect material adjacent the copper (Cu) interconnects in the semiconductor devices from being poisoned by copper (Cu) atoms diffusing from the copper (Cu) interconnect into the adjacent material. For example, the barrier layer(s) may protect adjacent silicon-containing structures from being poisoned by copper (Cu) atoms diffusing from the copper (Cu) interconnect into the adjacent silicon-containing structures.

A typical barrier layer is also referred to as a "diffusion barrier layer" or as an "etch stop layer". One commonly used barrier layer is silicon nitride ($Si_3N_4$) or SiN for short. Another commonly used barrier layer is amorphous silicon carbide or some combination of $SiC_xN_yH_zO_w$.

In prior art methods, oxygen ($O_2$) or $O_2$ containing gas mixtures have been used to etch silicon nitride. However, the use of $O_2$ and/or $O_2$ containing gas mixtures has resulted in damaging the copper interconnects. By way of example, the $O_2$ containing gas mixtures may include a hydro-fluoro-carbon gas such as $CH_2F_2$, and/or a fluoro-carbon gas such as $CF_4$. Thus, the selectivity ratio between a SiN layer to a silicon oxide containing dielectric layer is too low. Furthermore $O_2$ free gases, such as $CH_3F$, $N_2$, and $H_2$, generate undesirable polymers that are deposited on the IC structure. Therefore, each of the gas combinations, i.e, $O_2$ containing gas mixtures and $O_2$ free gases, has an associated limitation when etching a barrier layer.

SUMMARY

A method of etching a barrier layer in an integrated circuit (IC) wherein the barrier layer is composed of silicon nitride or silicon carbine. The method comprises receiving an etched IC structure having an etched trench and/or via with an exposed barrier layer. The method then proceeds to apply an etchant gas mixture comprising nitrous oxide ($N_2O$) and a fluoromethane ($CH_3F$) gas. Additionally, the etchant gas mixture may also include an inert diluent gas such as Argon (Ar). The etchant gas mixture provides a relatively high selectivity between the barrier layer to an adjacent silicon containing dielectric layer. The selectivity ratio between SiN to the adjacent silicon containing dielectric material is approximately 1.7 or more.

Once the barrier layer is etched away, the underlying interconnect structure is exposed. For dual damascene structures, the exposed interconnect is a copper interconnect structure. The etchant gas mixture provides the added benefit of oxidizing little or none of the underlying copper interconnect. Additionally, if there is a misalignment during the etching the of the barrier layer, the etchant gas mixture does not aggressively etch a dieletric adjacent the interconnect that may have been recently exposed from the etching of the barrier layer.

After barrier layer is etched, the method proceeds to deposit a thin barrier layer, and then a copper seed layer is then deposited. The IC structure is then filled with copper and the IC structure is planarized to remove the excess copper.

BRIEF DESCRIPTION OF THE DRAWINGS

Illustrative embodiments of the present invention are shown in the accompanying drawings wherein:

FIG. 3A through FIG. 3D is an isometric view of the etching of an SiN barrier layer and the deposition of copper to the IC structure.

DETAILED DESCRIPTION

In the following detailed description, reference is made to the accompanying drawings, which form a part hereof, and which show illustrative embodiments. These embodiments are described in sufficient detail to enable those skilled in the art to practice the invention, and it is to be understood that other embodiments may be utilized and that structural, logical and process changes may be made without departing from the spirit and scope of the claims. The following detailed description is, therefore, not to be taken in a limited sense. The leading digit(s) of the reference numbers in the Figures corresponds to the figure number, with the exception of identical components that appear in multiple figures and are identified by the same reference numbers.

Figure 1:
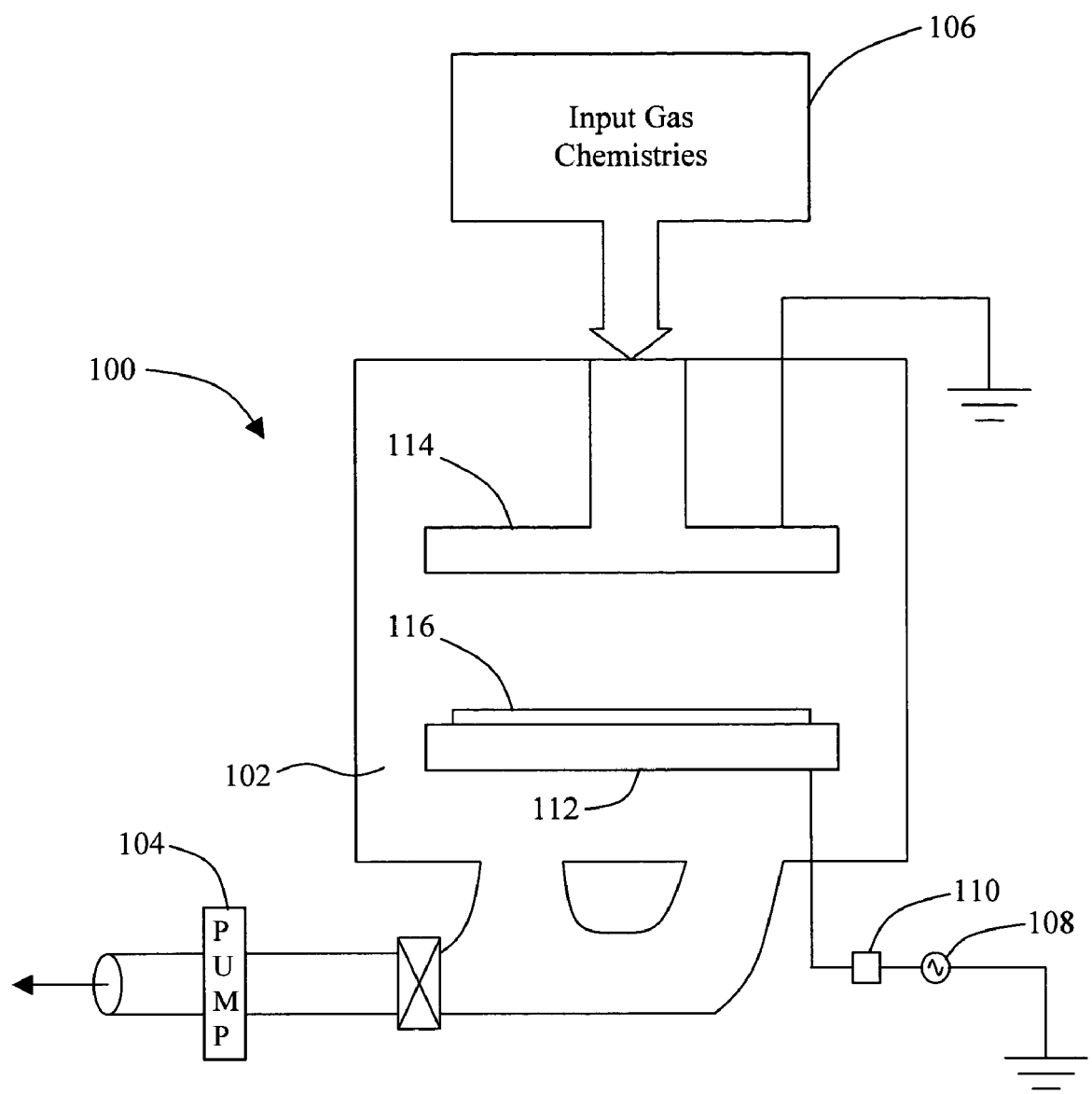
FIG. 1 is an illustrative system capable of etching a SiN barrier layer from an IC structure.

Referring to FIG. 1 there is shown an illustrative system capable of etching a silicon nitride or silicon carbide barrier layer from an IC structure. The illustrative system is also configured to perform hard mask etching, dielectric etching and photoresist removal. The illustrative system is a parallel plate plasma system 100 such as 200 mm EXELAN HPT system available from Lam Research Corporation from Fremont, Calif. The system 100 includes a chamber having an interior 102 maintained at a desired vacuum pressure by a vacuum pump 104 connected to an outlet in a wall of the reactor. Etching gas can be supplied to the plasma reactor supplying gas from gas supply 106. A medium density plasma can be generated in the reactor by a dual frequency arrangement wherein RF energy from RF source 108 is supplied through a matching network 110 to a powered electrode 112. The RF source 108 is configured to supply RF power at 27 MHz and 2 MHz. Electrode 114 is a grounded electrode. A substrate 116 is supported by the powered electrode 112 and is etched and/or stripped with plasma generated by energizing the gasses into a plasma state. Other capacitively coupled reactors can also be used such as reactors where RF power is supplied to both electrodes such as the dual frequency plasma etch reactor described in commonly owned U.S. Pat. No. 6,090,304, the disclosure of which is hereby incorporated by reference.

Alternatively, the plasma can be produced in various other types of plasma reactors referred to as inductively coupled plasma reactor, an electron-cyclotron resonance (ECR) plasma reactor, a helicon plasma reactor, or the like. Such plasma reactors typically have energy sources which use RF energy, microwave energy, magnetic fields, etc. to produce a medium to high density plasma. For instance, a high density plasma could be produced in a Transformer Coupled Plasma etch reactor available from Lam Research Corporation which is also called an inductively coupled plasma reactor.

Figure 2:
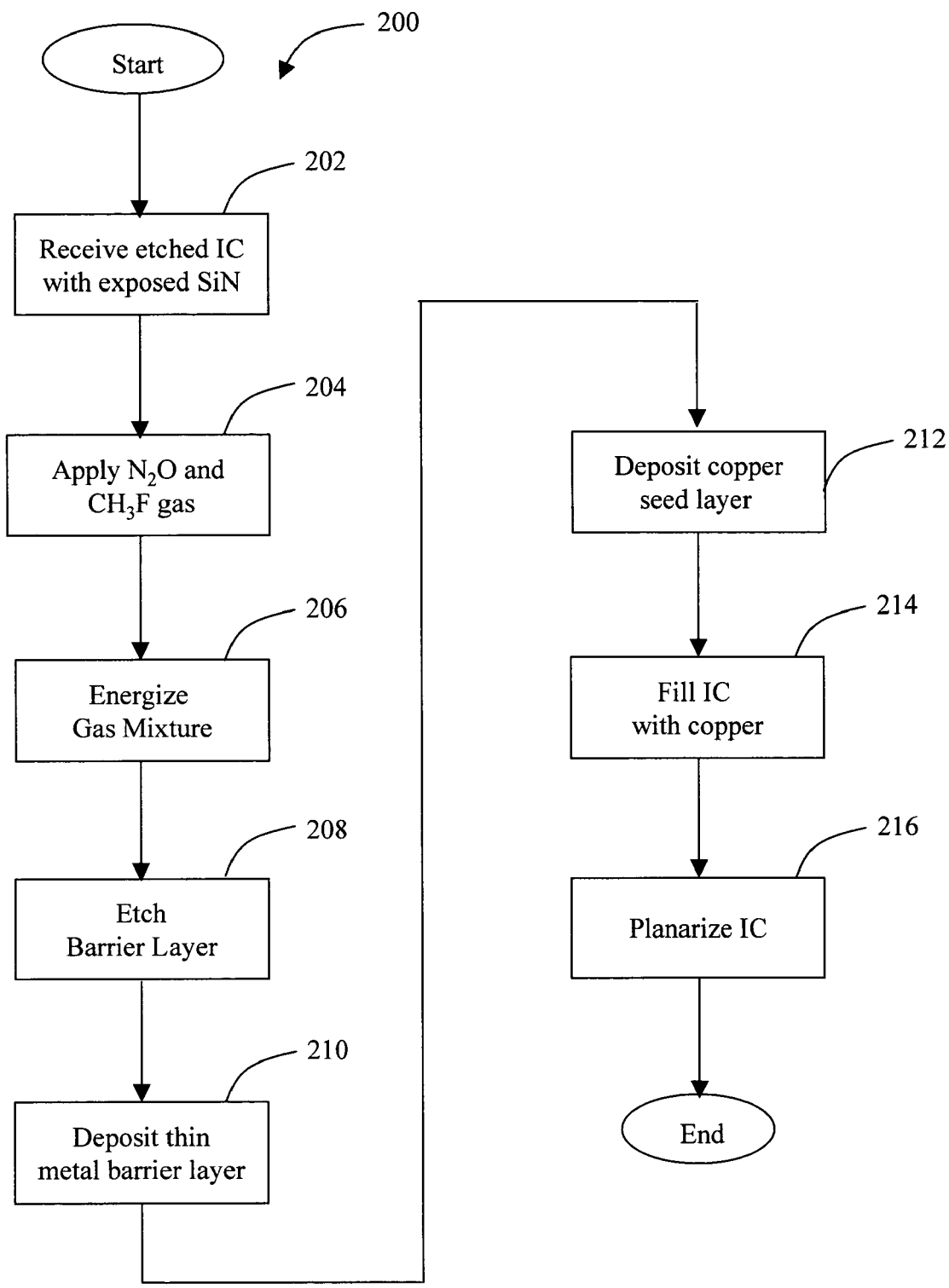
FIG. 2 is a flowchart for etching a SiN barrier layer during a dual damascene process.

Referring to FIG. 2 there is shown a flowchart of a method for etching a silicon nitride or silicon carbide barrier layer in a dual damascene process. The illustrative IC structure includes a first protective layer, a second dielectric layer, a third barrier layer, and a fourth layer having an interconnect. The first protective layer, second dielectric layer, and third barrier layer have been etched to generate a plurality of trenches and vias. An illustrative IC structure may be seen in FIG. 3A and in FIG. 4A which are both described in further detail below.

By way of example and not of limitation, the illustrative IC structure includes a first protective layer. The first protective layer is used to protect the second dielectric layer. It shall be appreciated by those skilled in the art that the type of protective layer used depends on the type of dielectric material in the second dielectric layer.

In one embodiment, the first protective layer may be a first cap layer. The first cap layer is composed of such cap materials as Silicon Dioxide ($SiO_2$), Silicon Oxynitride (SiON), and any other such silicon and oxygen containing materials. The cap layer provides protection for an illustrative SiLK dielectric. SiLK™ is a dielectric produced by the Dow Chemical Company.

In another embodiment, the first protective layer may be a first hardmask layer. The hardmask layer is composed of such hardmask materials as tantalum nitride (TaN), titanium nitride (TiN), silicon nitride (SiN), or silicon carbide (SiC). The hardmask material is used as a first protective layer for an illustrative silicon and oxygen containing dielectric.

In yet another embodiment, there is no first protective layer or the first protective layer has already been removed. By way of example and not of limitation, the first protective layer may have been removed during dual damascene processing. Thus, the method described here may be applied to an integrated circuit structure that either includes a first protective layer or an integrated circuit structure that does not include a first protective layer and has a fully exposed dielectric layer.

The second illustrative layer is a dielectric layer composed of such materials as silicon dioxide ($SiO_2$), organosilicate glass (OSG), fluorinated silicate glass (FSG), SiLK, or other similar materials. The silicon dioxide may be purchased as the precursor TEOS from Applied Materials of Santa Clara, Calif. For the illustrative IC structure the illustrative dielectric is represented as $SiO_2$ in FIG. 3 and FIG. 4.

In another embodiment, the dielectric layer is an OSG material such as CORAL™ from Novellus Systems of San Jose, Calif., or BLACK DIAMOND™ from Applied Materials of Santa Clara, Calif., or any other such OSG materials. In yet another embodiment, the dielectric material is a fluorinated silicate glass (FSG) film such as SPEED™ from Novellus Systems of San Jose, Calif. In still another embodiment, the dielectric material is SiLK™ which is a dielectric produced by the Dow Chemical Company.

Additionally, it shall be appreciated by those skilled in the art that the dielectric material may also be a porous dielectric material having an illustrative void space of greater than 30%.

The illustrative third barrier layer is composed of silicon nitride or silicon carbide (SiC). For purposes of this patent, the terms silicon nitride, SiN, and $Si_3N_4$ are used interchangeably. It shall be appreciated by those skilled in the art that the barrier layer provides protection from copper diffusion.

The illustrative fourth layer includes an interconnect that conducts electricity. For the illustrative example the interconnect is composed of copper. Alternatively, the interconnect may be composed of other conductors such as tungsten or aluminum. In the illustrative IC structure, the interconnect is surrounded by a dielectric material such as silicon oxide (SiO).

The flowchart in FIG. 2 describes the method 200 for etching a silicon nitride or silicon carbide barrier layer. In the illustrative example, the etching of the silicon nitride or silicon carbide occurs during the dual damascene processing. The method is initiated at process block 202 in which the illustrative IC structure embodied in a wafer is positioned in illustrative system 100.

At block 204, gas mixture of nitrous oxide (N$_2$O) and fluoromethane (CH$_3$F) is added by the system 100 to a reaction chamber. Typically, and inert gas such as Argon is also included in the illustrative gas mixture. The inert gas acts as a diluent. Other illustrative inert gases include other noble gases such as Helium, Neon, Krypton, and Xenon.

At block 206, a plasma is generated when the illustrative gas mixture is energized. The plasma then proceeds to etch the silicon nitride barrier layer as described in block 208. The illustrative selectivity ratio between SiN to the dielectric ranges from approximately 2 to approximately 7 depending on the type of dielectric, the IC structure, the type of reactor, and the process parameters used within the reactor.

In a rather broad embodiment, the range for the processing parameters may be practiced at operating pressures of 10 to 300 mTorr, at power ranges of 100 to 1000 W for RF power, at N$_2$O flow rates of 20 to 500 sccm, at CH$_3$F flow rates of 10 to 200 sccm, and Argon flow rates of 50 to 500 sccm.

In a less broad embodiment having a RF source configured to supply RF power at 27 MHz and 2 MHz, the range for the processing parameters may be practiced at operating pressures of 50 to 300 mTorr, at 200 to 400 W for 27 MHz RF power, at 0 to 200 W for 2 MHz RF power, at N$_2$O flow rates of 20 to 120 sccm, at CH$_3$F flow rates of 10 to 40 sccm, and Argon flow rates of 60 to 300 sccm.

In an even less broad embodiment that that uses the illustrative system 100, the range for the processing parameters may be practiced at operating pressures of 100 to 250 mTorr, at 250 to 350 W for 27 MHz RF power, at 0 to 100 W for 2 MHz RF power, at N$_2$O flow rates of 40 to 100 sccm, at CH$_3$F flow rates of 10 to 30 sccm, and Argon flow rates of 50 to 200 sccm.

By way of example and not of limitation, a plurality of different process parameters for etching the SiN barrier layer with the illustrative system 100 is shown in Table 1.

TABLE 1

Illustrative Process Parameter For Etching Silicon Nitride

| Run # | Press (mTorr) | 27 MHz RF Power (W) | 2 MHz RF Power (W) | Ar Flow (sccm) | CH$_3$F Flow (sccm) | N$_2$O Flow (sccm) | SiN ER (Å/min) | SiO$_2$ ER (Å/min) |
|---|---|---|---|---|---|---|---|---|
| 1 | 200 | 300 | 150 | 100 | 20 | 40 | 929 | 558 |
| 2 | 200 | 300 | 150 | 100 | 20 | 80 | 772 | 242 |

In Table 1, the process parameters for two different "runs" are shown. The runs were performed on a 200 mm wafer at 20° C. The temperature range may vary from 0° C. to 50° C. The etch time during the etching of the SiN was 30 seconds. The etch time may vary from 5 to 50 seconds. The selectivity for the first run is based on taking the ratio of the SiN etch rate to the SiO$_2$ etch rate which results in a selectivity ratio of 1.7. For the second run the selectivity ratio between the SiN to the SiO$_2$ is improved to 3.2.

At block 210, a thin barrier layer is then applied across the entire IC structure. By way of example, the thin barrier layer is Tantalum, Tantalum Nitride or the like. In the illustrative process, the thin barrier metal layer is applied using vapor-phase deposition. The thin barrier materials are typically used to protect material adjacent the illustrative copper (Cu) interconnects from being poisoned by copper atoms diffusing from the copper interconnect into the adjacent materials. For example, the thin barrier layer may protect adjacent silicon-containing materials from being poisoned by copper atoms diffusing from the copper interconnect into the adjacent silicon containing materials.

At block 212, a seed copper layer is applied using vapor-phase deposition such as physical vapor deposition or chemical vapor deposition. At block 214, the bulk of the copper is then added using well known electroplating methods. The method then proceeds to block 216 in which the layer of copper is planarized using chemical mechanical planarization (CMP). The planarization clears all the excess copper down to the illustrative first protective layer. In another embodiment, the planarization also removes the illustrative first protective layer from above the dielectric layer. The planarization leaves an IC structure in which the via and trenches are filled with copper.

Those skilled in art having the benefit of this disclosure shall appreciate that the method described above permits the etching of silicon nitride and silicon carbide to be performed in the same reactor that is used for etching the dielectric layer.

The inventors' hypothesize that mechanisms at work in this method are due to N$_2$O being a milder oxidant than O$_2$. As a result of having a milder oxidant there is reduced copper oxidation. Additionally, the inventors' hypothesize that the N$_2$O does not generate as much heavy polymer deposition.

Referring to FIG. 3A through FIG. 3D there is shown a plurality of isometric views 300 for the etching of a barrier layer in which the barrier layer is composed of silicon nitride and/or silicon carbide as described above. The illustrative IC structures described below provides an illustrative example that serves to further clarify the invention.

FIG. 3A shows an isometric view of the illustrative IC structure having a first cap layer 302, a second dielectric layer 304 composed of SiO$_2$, a third barrier layer 306 composed of silicon nitride, and a fourth layer that includes the copper interconnect 308 and an adjacent dielectric 310 such as silicon oxide (SiO) that surrounds the copper interconnect 308. A trench 312 and a via 314 is etched into the illustrative IC structure. As shown, the barrier layer 306 is exposed through the via 314. The illustrative IC structure is received as a wafer by the illustrative system 100 as described above in block 202.

The method then proceeds to apply the etchant gas mixture that includes nitrous oxide and fluoromethane as described in block 204. The etchant gas mixture is energized and the illustrative silicon nitride barrier layer is etched as described in block 206 and block 208. The resulting IC structure is shown in FIG. 3B where the barrier layer has been etched through via 314 resulting in changing the depth of the via 314. In FIG. 3B the via 314 is shown making contact with the illustrative copper interconnect 308.

The method then proceeds to deposit a thin metal barrier layer over the entire IC structure as described previously in block 210. Additionally, a copper seed layer is deposited as described in block 212. The deposited materials 316 are shown in FIG. 3C and are shown to occupy the via 314 and trench 312.

The IC structure is then filled with copper as described in block 214, and the IC structure is planarized to remove the excess copper as described in process 216. The resulting IC structure is shown in FIG. 3D in which the copper has filled both the via 314 and trench. The copper filled via 314 is separated from the underlying copper interconnect 308 by the thin metal barrier layer 316.

Referring to FIG. 4A through FIG. 4D there is shown an isometric view of the plurality of sequences 400 for etching a SiN barrier layer in which the via is misaligned with the underlying copper interconnect. However, unlike the IC structure described in FIG. 3A, the lithography for generating trench 412 and the via 414 has resulted in a misalignment between the via 414 and the interconnect 408.

Figure 4A:
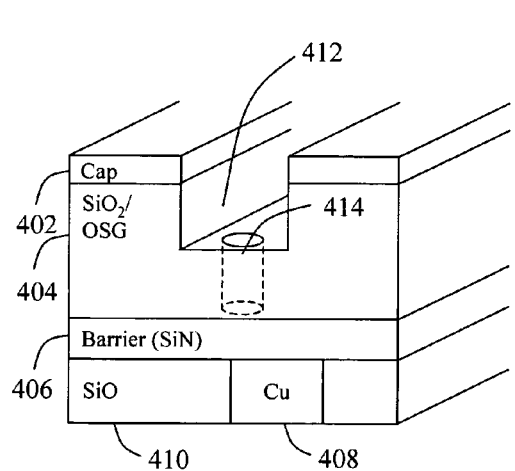
FIG. 4A through FIG. 4D is an isometric view of the etching of an SiN barrier layer that results in a misaligned IC structure.
Figure 4B:
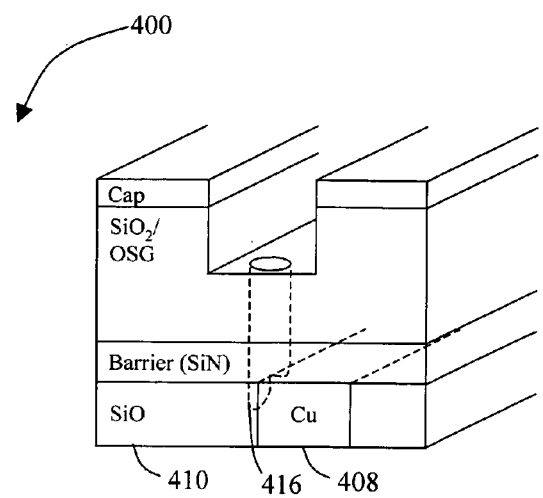
Figure 4C:
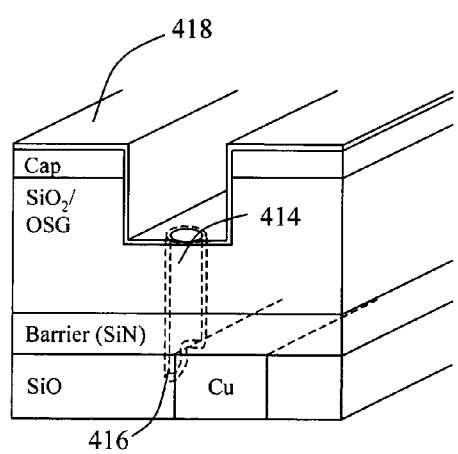
Figure 4D:
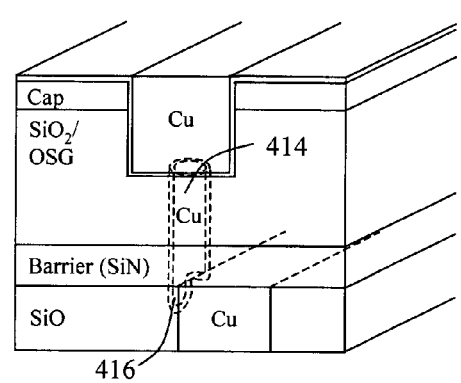

FIG. 4A shows an isometric view of the illustrative misaligned IC structure. As previously described above, the illustrative IC structure includes a first cap layer 402, a second dielectric layer 404 composed of silicon dioxide, a third barrier layer 406 composed of silicon nitride, and a fourth layer that includes the copper interconnect 408 and an adjacent dielectric 410 such as silicon oxide (SiO) that surrounds the copper interconnect 408.

When the method proceeds to apply the etchant gas mixture to etch the barrier layer, the etchant gas mixture partially etches the adjacent dielectric 410 and generates the cavity 416 adjacent the interconnect 408. The etchant gas mixture provides the benefit of not aggressively etching the adjacent dielectric 410, due to the relatively high selectivity of the silicon nitride barrier layer to silicon containing dielectric material. Those skilled in the art shall appreciate that if the etchant gas mixture had etched through the adjacent dielectric 410, then the IC structure would have been compromised and would likely not be functional.

The method then proceeds to deposit a thin metal barrier layer and a copper seed layer over the entire IC structure as described above. The deposited materials 418 are shown in FIG. 3C and are shown to occupy the cavity 416 within the via 414.

The IC structure is then filled with copper and the IC structure is planarized to remove the excess copper. The resulting IC structure is shown in FIG. 3D in which the copper has filled both the cavity 416, the via 414 and trench 412 without compromising the IC structure. Thus, even though there was a misalignment in the IC structure, the IC structure was salvageable by using the selective etchant gas mixture described above. It shall also be appreciated by those skilled in the art having the benefit of this disclosure that the selectivity of the barrier metal etchant gas mixture described above can be applied to an IC structure having silicon and oxygen containing materials. By way of example and not of limitation, the location of the silicon and oxygen containing materials include the first protective layer, the second dielectric layer, and the interconnect layer having the surrounding dielectric material as described above.

Although the description about contains many limitations in the specification, these should not be construed as limiting the scope of the claims but as merely providing illustrations of some of the presently preferred embodiments of this invention. Many other embodiments will be apparent to those of skill in the art upon reviewing the description. Thus, the scope of the invention should be determined by the appended claims, along with the full scope of equivalents to which such claims are entitled.

What is claimed is:

1. A method of etching an integrated circuit (IC) structure having a first dielectric layer with a barrier layer, wherein said barrier layer is composed of a material consisting essentially of silicon nitride and is disposed below said first dielectric layer, said barrier layer being disposed above a second layer having therein a metal interconnect co-planarly disposed adjacent to a dielectric material, said method comprising:
    feeding a nitrous oxide ($N_2O$) gas and a fluoromethane ($CH_3F$) gas into a reactor;
    generating a plasma in said reactor;
    etching said barrier layer through a via that is disposed in said first dielectric layer, wherein said etching said barrier layer etches down to said metal interconnect and partially etches said dielectric material with said plasma generated from said $N_2O$ gas and said $CH_3F$ gas.

2. The method of claim 1 wherein said dielectric material is comprised of materials that include silicon and oxygen.

3. The method of claim 2 wherein a selectivity of said barrier layer to said dielectric material is 1.7 or more.

4. The method of claim 1 wherein said dielectric material is composed of a material selected from the group consisting of silicon dioxide, silicon oxide, organosilicate glass, SiLK, and fluorinated silicate glass.

5. The method of claim 1 further comprising depositing a thin barrier layer over said IC structure.

6. A method of etching an integrated circuit (IC) structure having a first dielectric layer, a second barrier layer wherein said second barrier layer is composed of a material consisting essentially of silicon nitride, and a third layer having a copper interconnect co-planarly disposed adjacent to a dielectric material, said second barrier layer being disposed between said first dielectric layer and said third layer, comprising:
    feeding a nitrous oxide ($N_2O$) gas and a fluoromethane ($CH_3F$) gas into a reactor;
    generating a plasma in said reactor; and
    etching said second barrier layer, wherein said etching said second barrier layer forms a via in said second barrier layer, said via at least partially overlaps said dielectric material thereby enabling said etching said second barrier layer to at least partially etch said dielectric material with said plasma generated from said $N_2O$ gas and said $CH_3F$ gas; and
    terminating said etching said second barrier layer before said dielectric material is etched through.

7. The method of claim 6 wherein a selectivity of said second barrier layer to said dielectric material is 1.7 or more.

8. The method of claim 6 wherein said dielectric material is composed of a material selected from the group consisting of silicon dioxide, silicon oxide, organosilicate glass, SiLK, and fluorinated silicate glass.

9. The method of claim 6 further comprising depositing a thin barrier layer over said IC structure.

10. A method of etching an integrated circuit (IC) structure having a via etched into a first dielectric layer composed of a first dielectric material, a second barrier layer wherein said second barrier layer is composed of a material consisting essentially of silicon nitride, and a third layer having a conductive interconnect co-planarly disposed adjacent to a second dielectric material that comprises silicon and oxygen, said second barrier layer being disposed between said first dielectric layer and said third layer, comprising:

feeding a nitrous oxide ($N_2O$) gas and a fluoromethane ($CH_3F$) gas into a reactor;

generating a plasma in said reactor;

etching said second barrier layer, wherein said etching said second barrier layer etches a via through said second barrier layer to both said conductive interconnect and said second dielectric material, whereby said etching said second barrier layer partially etches said second dielectric material with said plasma generated from said $N_2O$ gas and said $CH_3F$ gas and terminates before said second dielectric material is etched through.

11. The method of claim 10 wherein a selectivity of said second barrier layer to said second dielectric material is 1.7 or more.

12. The method of claim 11 wherein said second dielectric material is composed of a material selected from the group consisting of silicon dioxide, silicon oxide, organosilicate glass, SiLK, and fluorinated silicate glass.

13. The method of claim 12 further comprising depositing a thin barrier layer over said IC structure.

14. The method of claim 10 wherein said via and said conductive interconnect are misaligned, thereby causing said via to extend to both said conductive interconnect and said second dielectric material.

15. The method of claim 14 further comprising depositing a thin barrier layer over said IC structure that covers said cavity and said via.

* * * * *